(12) United States Patent
Hashimoto

(10) Patent No.: US 6,888,158 B2
(45) Date of Patent: May 3, 2005

(54) BARE CHIP CARRIER AND METHOD FOR MANUFACTURING SEMICONDUCTOR DEVICE USING THE BARE CHIP CARRIER

(75) Inventor: Osamu Hashimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 233 days.

(21) Appl. No.: 09/956,348

(22) Filed: Sep. 20, 2001

(65) Prior Publication Data

US 2002/0111051 A1 Aug. 15, 2002

(30) Foreign Application Priority Data

Feb. 15, 2001 (JP) .......................... 2001-038640

(51) Int. Cl.$^7$ .......................... H01L 23/48; H01L 23/52; H01L 23/40; H05K 1/00; H05K 1/18
(52) U.S. Cl. .......................... 257/48; 257/737; 257/739; 361/748
(58) Field of Search .......................... 361/748; 257/48, 257/739, 737

(56) References Cited

U.S. PATENT DOCUMENTS

| | | | | |
|---|---|---|---|---|
| 5,130,779 A | * | 7/1992 | Agarwala et al. | 257/772 |
| 5,163,834 A | | 11/1992 | Chapin et al. | |
| 5,194,931 A | * | 3/1993 | Araki | 257/734 |
| 5,517,752 A | * | 5/1996 | Sakata et al. | 29/832 |
| 5,545,589 A | * | 8/1996 | Tomura et al. | 438/119 |
| 5,592,736 A | * | 1/1997 | Akram et al. | 29/841 |
| 5,767,580 A | * | 6/1998 | Rostoker | 257/737 |
| 5,770,891 A | | 6/1998 | Frankeny et al. | |
| 5,915,977 A | * | 6/1999 | Hembree et al. | 439/74 |
| 5,931,685 A | * | 8/1999 | Hembree et al. | 439/74 |
| 5,962,921 A | * | 10/1999 | Farnworth et al. | 257/773 |
| 5,984,691 A | | 11/1999 | Brodsky et al. | |
| 6,010,340 A | | 1/2000 | Campbell et al. | |
| 6,365,842 B1 | * | 4/2002 | Jiang | 174/261 |
| 6,424,049 B1 | * | 7/2002 | Sameshima | 257/777 |
| 2001/0011724 A1 | * | 8/2001 | Maruyama et al. | 257/48 |
| 2001/0040289 A1 | * | 11/2001 | Kobayashi | 257/737 |
| 2002/0110953 A1 | * | 8/2002 | Ahn et al. | 438/106 |
| 2002/0185721 A1 | * | 12/2002 | Hwang et al. | 257/678 |

FOREIGN PATENT DOCUMENTS

| | | |
|---|---|---|
| JP | 9-161926 | 6/1997 |
| JP | 9-320720 | 12/1997 |
| JP | 10-213626 | 8/1998 |

* cited by examiner

Primary Examiner—David E. Graybill
(74) Attorney, Agent, or Firm—McDermott, Will & Emery

(57) ABSTRACT

A bare chip carrier for holding a bare chip includes a bare chip carrier base member, a bump electrode which is located above a principal surface of the bare chip carrier base member and which is to be connected to a pad electrode of the bare chip, a bare chip carrier electrode which is formed on a back surface of the bare chip carrier base member and which has a recessed portion, and a wiring that connects the bump electrode to the bare chip carrier electrode.

6 Claims, 4 Drawing Sheets

BARE CHIP CARRIER AND METHOD FOR MANUFACTURING SEMICONDUCTOR DEVICE USING THE BARE CHIP CARRIER

BACKGROUND OF THE INVENTION

1. Field of the Invention

The present invention relates to a bare chip carrier which is used in an electrical test of semiconductor bare chips, and more specifically to electrical connection of the bare chip carrier.

2. Description of the Background Art

When a semiconductor bare chip (hereafter simply referred to as "a bare chip") diced from a semiconductor wafer is to be shipped as it is as a product, the bare chip must undergo electrical tests (also called electrical measurements) using semiconductor test system such as an IC tester or a burn-in system.

At this time, a bare chip carrier is used for mounting the above-described bare chip on an IC socket on a testing board used in the IC tester or on a burn-in board used in the burn-in system. That is, the bare chip carrier that holds the bare chip is mounted on the IC socket to conduct various electrical tests.

A conventional bare chip carrier will be described below.

FIG. 6 is a cross-sectional view for illustrating a conventional bare chip carrier.

As shown in FIG. 6, the bare chip carrier comprises a bare chip carrier base member (hereafter simply referred to as a base member) 1, and a bump electrode 3 for electrically connecting the base member 1 with a pad electrode 21 of a bare chip 2. Furthermore, the bare chip carrier comprises a bare chip carrier lid 6 for fixing the bare chip 2 on the base member 1, an insulating film 7 for electrically insulating the bare chip 2 from a wiring 9, a bare chip carrier electrode 8 for connecting the bare chip carrier to an external IC socket, and the wiring 9 for connecting the bare chip carrier electrode 8 with the bump electrode 3.

Here, the bare chip carrier electrode 8 and the wiring 9 are integrally formed of an electrically conductive film. In other words, an electrically conductive film is used as a bare chip carrier electrode in the above-described conventional bare chip carrier.

However, the electrically conductive film has a problem that the mechanical strength is low, and deformation, such as warping or bending, occurs easily. Therefore, there is a problem that defective contact occurs between the bare chip carrier electrode 8 and a connecting terminal (e.g., a contactor described later) of the IC socket connected to the electrode 8.

As a countermeasure for this problem, a bare chip carrier electrode is directly formed on the base member in the bare chip carrier disclosed in Japanese Patent Laid-Open No. 10-213626. According to this bare chip carrier, the stability of contact between the connecting terminal of the IC socket and the bare chip carrier electrode is maintained without being affected by deformation such as warping or bending.

The Specification also discloses that a bump electrode similar to the one used in semiconductor devices of the BGA structure is formed on the bare chip carrier electrode to correspond to a burn-in socket for BGA.

In the above-described prior art, however, nothing has been devised regarding the structure of electrodes used in the bare chip carrier. Conventionally, a pad electrode, a bump electrode, or the like has been used as the bare chip carrier electrode. In other words, a well-known electrode used in a semiconductor device has simply been used as the bare chip carrier electrode.

In recent years, when electrical tests are conducted, high electrical and mechanical contact is required between an IC socket and a bare chip carrier.

However, high electrical and mechanical contact cannot be achieved in the structure of conventional bare chip carrier electrodes.

SUMMARY OF THE INVENTION

The present invention has been conceived to solve the previously-mentioned problems and a general object of the present invention is to provide a novel and useful bare chip carrier, and is to provide a novel and useful method for manufacturing a semiconductor device.

A more specific object of the present invention is to provide a bare chip carrier that has high electrical and mechanical contact characteristics.

The above object of the present invention is attained by a following bare chip carrier and a following method for manufacturing a semiconductor device.

According to first aspect of the present invention, the bare chip carrier for holding a bare chip comprises: a base member; a first electrode which is formed on a principal surface of the base member, and which is connected to the bare chip; a second electrode which is formed on a back surface of the base member, and which has a recessed portion; and a wiring that connects the first electrode to the second electrode.

According to second aspect of the present invention, the bare chip carrier for holding a bare chip comprises: a base member; a first electrode which is formed on a principal surface of the base member, and which is connected to the bare chip; a second electrode which is formed on a back surface of the base member, and which has a rough surface portion; and a wiring that connects the first electrode to the second electrode.

According to third aspect of the present invention, the method for manufacturing a semiconductor device, comprises a step of performing electrical test of a bare chip using the bare chip carrier according to the first and second aspects of the present invention.

Other objects and further features of the present invention will be apparent from the following detailed description when read in conjunction with the accompanying drawings.

DETAILED DESCRIPTION OF THE PREFERRED EMBODIMENTS

Figure 1:
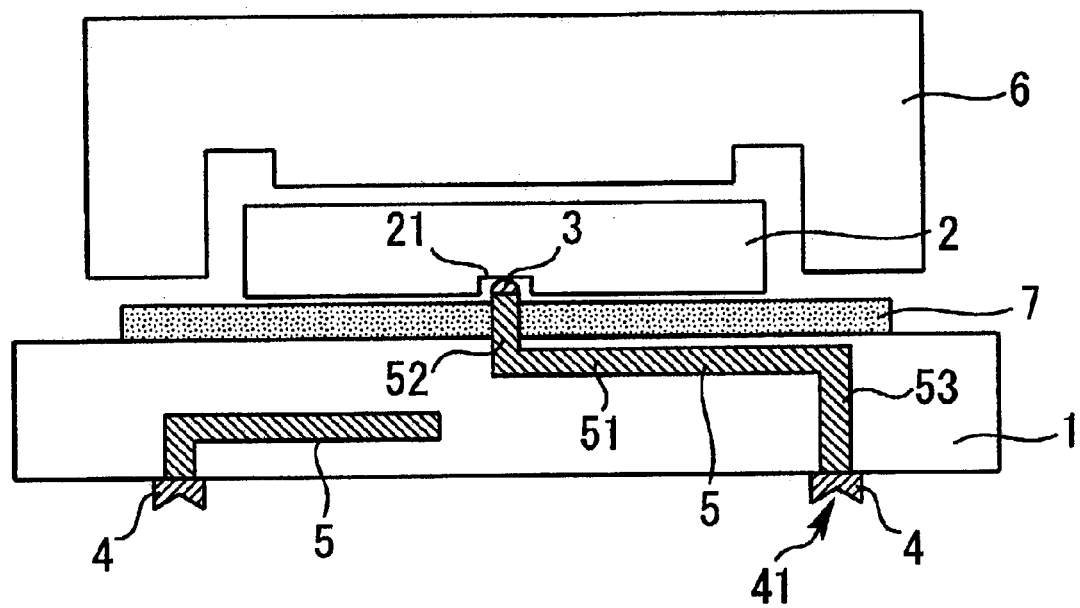
FIG. 1 is a cross-sectional view for illustrating a bare chip carrier according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

FIG. 1 is a cross-sectional view for illustrating a bare chip carrier according to a first embodiment of the present invention.

In FIG. 1, reference numeral 1 represents a bare chip carrier base member (hereinafter simply referred to as "a base member"), 2 represents a bare chip, 21 represents a pad electrode, 3 represents a bump electrode, 4 represents a bare chip carrier electrode, 41 represents conically recessed portion, 5 represents a wiring, 6 represents a bare chip carrier lid, and 7 represents an insulating film.

The base member 1 is adopted to hold the bare chip 2, and is formed of a wiring substrate of an insulating resin or the like similar to a burn-in board and a testing board.

The bare chip 2 is a semiconductor device held on the base member 1, undergoes electrical tests by a semiconductor test system (not shown). Also, the bare chip 2 has a plurality of pad electrodes 21 for connecting to the bump electrodes 3.

The bump electrode 3 is formed on a tip of the wiring 5 disposed through the insulating film 7, and is located above the insulating film 7. A plurality of bump electrodes 3 are connected to a plurality of pad electrodes 21 of the bare chip 2. Also, the bump electrodes 3 are electrically connected to the bare chip carrier electrode 4 through the wiring 5.

The bare chip carrier electrode 4, which will be described in detail later, is formed on the back surface of the base member 1, and has a recessed portion 41. Also, the bare chip carrier electrode 4 is electrically and mechanically contacted to a contactor of the IC socket (described later). The bare chip carrier electrode 4 is also electrically connected to the bump electrode 3 through the wiring 5.

The wiring 5 is adopted to connect the bump electrode 3 to the bare chip carrier electrode 4. The wiring 5 includes a wiring 51 disposed in the base member 1 in the horizontal direction, a wiring 52 for connecting the wiring 51 with the bump electrode 3, a wiring 53 for connecting the wiring 51 with the bare chip carrier electrode 4, and other bump electrodes and wirings (not shown).

The wiring 5 is substantially formed inside the base member 1. The wiring 52 of the wiring 5 is formed through the insulating film 7. The tip of the wiring 52 is located above the insulating film 7.

Also, the wiring 5 in the left side of FIG. 1 is connected to another bump electrode 3 (not shown), and this bump electrode 3 is connected to another pad electrode 21 (not shown) of the bare chip 2.

The lid 6 is adopted to push the bare chip 2 downward from the upper direction of FIG. 1 for fixing the bare chip 2 on the base member 1.

The insulating film 7 is disposed between the principal surface of the base member 1 and the bottom surface of the bare chip 2, and electrically insulates the bare chip 2 from the base member 1.

Next, the bare chip carrier electrode 4 will be described.

Figure 2:
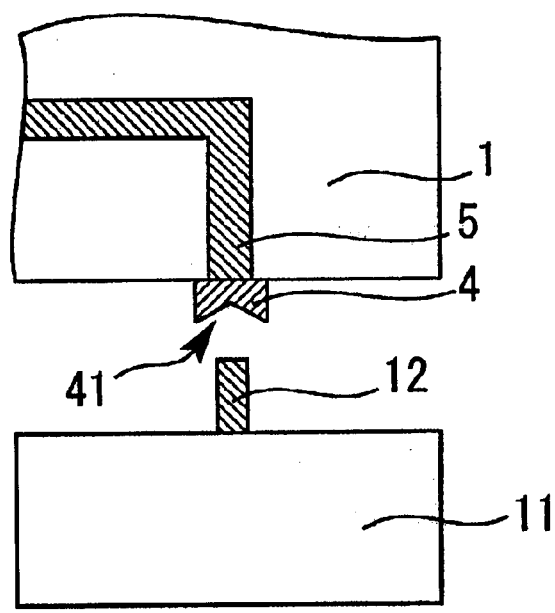
FIG. 2 is a cross-sectional view for illustrating the shape of the bare chip carrier electrode shown in FIG. 1.

FIG. 2 is a cross-sectional view for illustrating the shape of the bare chip carrier electrode shown in FIG. 1, that is, the shape of the bare chip carrier electrode in the bare chip carrier according to a first embodiment.

In FIG. 2, the reference numeral 11 represents a contactor section (or contact board) of the IC socket, and 12 represents the contactor of the IC socket.

As shown in FIGS. 1 and 2, the bare chip carrier electrode 4 has a recessed portion 41.

The recessed portion 41 is formed by removing the bare chip carrier electrode 4 conically or truncated-conically. Thus, the bare chip carrier electrode 4 has an inverted crown shape.

The recessed portion 41 is formed facing down in FIG. 2. This is for connecting the contactor 12 from the bottom (upward direction).

As shown in FIG. 2, the recessed portion 41 of the bare chip carrier electrode 4 is electrically and mechanically contacted to the contactor 12 formed on the contactor section 11 of the IC socket. Thereby, the bare chip carrier holding a bare chip 2 is electrically connected to the semiconductor test system through the IC socket, and the electrical tests are conducted.

As described above, in the bare chip carrier according to the first embodiment, a recessed portion 41 is formed in the bare chip carrier electrode 4 connected to the IC socket.

Through the use of this bare chip carrier, the contactor 12 of the IC socket is contacted to the recessed portion 41 of the bare chip carrier electrode 4 at multiple points. Also, since the end of the contactor 12 is inserted to the recessed portion 41 of the bare chip carrier electrode 4, the alignment accuracy of the bare chip carrier on the IC socket can be improved.

Therefore, the electrical and mechanical contact between the IC socket and the bare chip carrier can be improved. Thereby, the electrical tests of the semiconductor device (bare chip) can be conducted at high accuracy. Thus, the reliability of the semiconductor device that has passed the electrical tests can be improved.

In the first embodiment, although the recessed portion 41 is formed by removing the bare chip carrier electrode 4 conically (or truncated-conically), the shape of the recessed portion is not limited to circular-conical. For example, the bare chip carrier electrode 4 may be removed triangular-conically, quadrangular-conically, or semi-spherically. In these cases, the contactor 12 is contacted to the recessed portion 41 at multiple points, and the above-described effect can be obtained.

Second Embodiment

Figure 3:
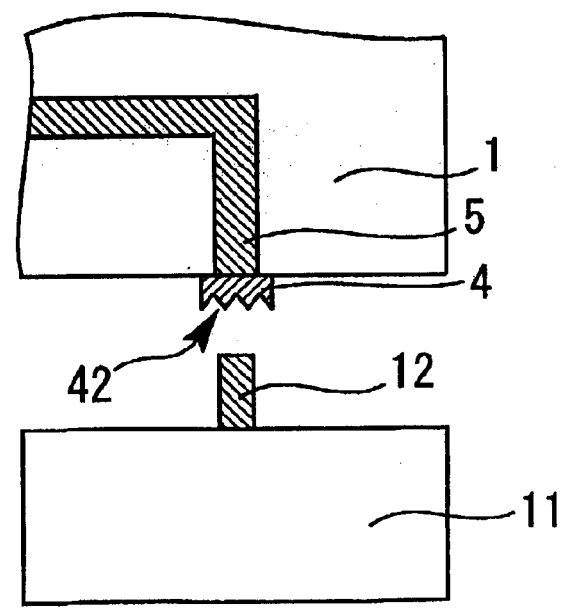
FIG. 3 is a cross-sectional view for illustrating the shape of a bare chip carrier electrode in a bare chip carrier according to a second embodiment of the present invention.

FIG. 3 is a cross-sectional view for illustrating the shape of a bare chip carrier electrode in a bare chip carrier according to a second embodiment of the present invention.

The difference between the bare chip carrier according to the second embodiment and the bare chip carrier according to the first embodiment is the structure of bare chip carrier electrode.

The following description is focused on this difference, i.e., the shape of the bare chip carrier electrode.

As shown in FIG. 3, the bare chip carrier electrode 4 in the second embodiment has a rough surface portion 42. The rough surface portion 42 has a plurality of recesses.

The rough surface portion 42 is formed using, for example, chemical treatment or blasting.

The rough surface portion 42 is not limited to the shape shown in FIG. 3 in which recesses are regularly formed, but the recesses may be formed irregularly.

The rough surface portion 42 of the bare chip carrier electrode 4 is electrically and mechanically contacted to the contactor 12 of the IC socket. Thereby, the bare chip carrier holding a bare chip is electrically connected to the semiconductor test system through the IC socket, and the electrical tests are conducted.

As described above, in the bare chip carrier according to the second embodiment, a rough surface portion 42 is formed in the surface of the bare chip carrier electrode 4.

Through the use of this bare chip carrier, the contactor 12 of the IC socket is contacted to the rough surface portion 42 of the bare chip carrier electrode 4 at multiple points.

Therefore, the electrical and mechanical contact between the IC socket and the bare chip carrier can be improved, and the same effect as in the first embodiment can be obtained.

Third Embodiment

Figure 4:
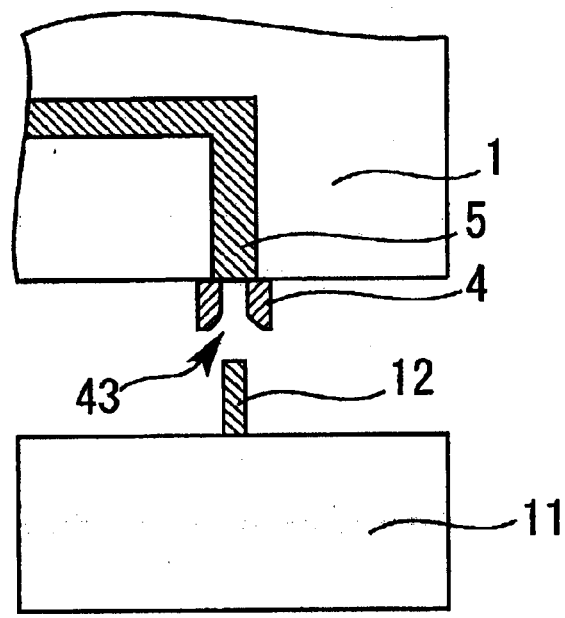
FIG. 4 is a cross-sectional view for illustrating the shape of a bare chip carrier electrode in a bare chip carrier according to a third embodiment of the present invention.

FIG. 4 is a cross-sectional view for illustrating the shape of a bare chip carrier electrode in a bare chip carrier according to a third embodiment of the present invention.

The difference between the bare chip carrier according to the third embodiment and the bare chip carrier according to the first embodiment is the structure of bare chip carrier electrode.

The following description is focused on this difference, i.e., the structure of the bare chip carrier electrode.

As shown in FIG. 4, the bare chip carrier electrode 4 in the third embodiment is a plug-in type electrode.

In other words, the bare chip carrier electrode 4 has an open hole 43.

The open hole 43 is formed downwardly in FIG. 4, in order to insert the contactor 12 from the bottom (upward direction). Therefore, the diameter of the open hole 43 corresponds to the shape of the contactor 12 of the IC socket.

Furthermore, the open hole 43 in the bare chip carrier electrode 4 shown in FIG. 4 is formed so that the diameter is the largest at the surface of the electrode 4 and becomes smaller with increase in the depth.

The contactor 12 of the IC socket is inserted into the open hole 43 of the bare chip carrier electrode 4, whereby the contactor 12 is electrically and mechanically contacted to the bare chip carrier electrode 4. Thereby, the bare chip carrier holding the bare chip 2 is electrically connected to the semiconductor test system through the IC socket, thereafter the electrical tests are conducted.

As described above, in the bare chip carrier according to a third embodiment, an open hole 43 is formed in the bare chip carrier electrode 4.

Through the use of this bare chip carrier, the contactor 12 of the IC socket is inserted into the open hole 43 to be contacted at multiple points. Also, the alignment accuracy of the bare chip carrier on the IC socket can be improved.

Therefore, the electrical and mechanical contact between the IC socket and the bare chip carrier can be improved, and the same effect as in the first embodiment can be obtained.

The inner surface of the open hole 43 may be processed to be rough (see the second embodiment). In this case also, the contactor 12 is contacted to the bare chip carrier electrode 4 at multiple points, and the above-described effects can be obtained.

Fourth Embodiment

Figure 5:
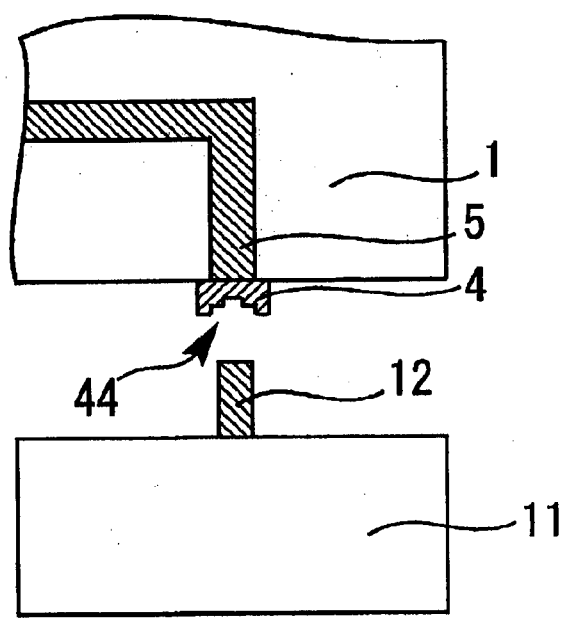
FIG. 5 is a cross-sectional view for illustrating the shape of a bare chip carrier electrode in a bare chip carrier according to a fourth embodiment of the present invention.
Figure 6:
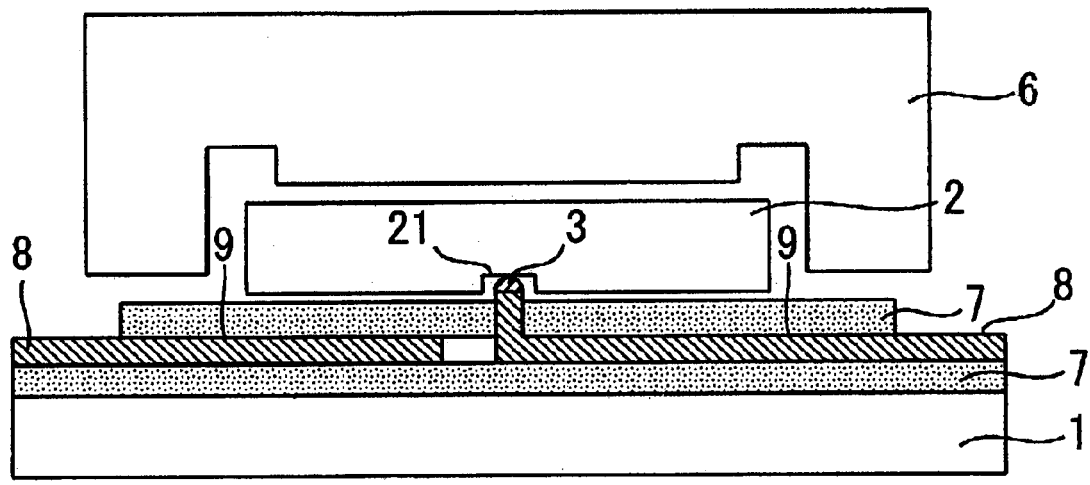
FIG. 6 is a cross-sectional view for illustrating a conventional bare chip carrier.

FIG. 5 is a cross-sectional view for illustrating the shape of a bare chip carrier electrode in a bare chip carrier according to a fourth embodiment of the present invention.

The difference between the bare chip carrier according to the fourth embodiment and the bare chip carrier according to the first embodiment is the structure of bare chip carrier electrode.

The following description is focused on this difference, i.e., the structure of the bare chip carrier electrode.

As shown in FIG. 5, the bare chip carrier electrode 4 in the fourth embodiment is a combination of bare chip carrier electrodes of above-described first and second embodiments. That is to say, the bare chip carrier electrode 4 in the present embodiment has a recessed portion 44, and the recessed portion 44 has a rough surface.

More specifically, the recessed portion 44 is formed by removing the bare chip carrier electrode 4 conically or truncated-conically, and the surface is processed to be rough by, for example, chemical treatment or blasting. Thus, the recessed portion 44 has a step-wise shape.

Also, the recessed portion 44 that has a rough surface is formed downwardly in FIG. 5, in order to be contacted with the contactor 12 from the bottom (upward direction).

The recessed portion 44 that has a rough surface of the bare chip carrier electrode 4 is electrically and mechanically contacted to the contactor 12 formed on the contactor section 11. Thereby, the bare chip carrier holding the bare chip 2 is electrically connected to the semiconductor test system through the IC socket, thereafter the electrical tests are conducted.

As described above, in the bare chip carrier according to the fourth embodiment, a recessed portion is formed in the bare chip carrier electrode 4, and the surface of the recessed portion is processed to be rough.

Through the use of this bare chip carrier, the contactor 12 of the IC socket is contacted to the bare chip carrier electrode 4 at multiple points. Also, the alignment accuracy of the bare chip carrier on the IC socket can be improved.

Therefore, the electrical and mechanical contact between the IC socket and the bare chip carrier is improved, and the same effect as in the first embodiment can be obtained.

This invention, when practiced illustratively in the manner described above, provides the following major effects:

According to the present invention, there can be provided a bare chip carrier having high electrical and mechanical contacting characteristics.

Also, the electrical tests of the bare chip using the bare chip carrier of the present invention can improve the reliability of the semiconductor device.

Further, the present invention is not limited to these embodiments, but variations and modifications may be made without departing from the scope of the present invention.

The entire disclosure of Japanese Patent Application No. 2001-038640 filed on Feb. 15, 2001 containing specification, claims, drawings and summary are incorporated herein by reference in its entirety.

What is claimed is:

1. A bare chip carrier for holding a bare chip, comprising:
   a base member;
   a first electrode which is located above a principal surface of said base member, and which is to be connected to said bare chip;
   a second electrode which is formed on a back surface of said base member, and which has a recessed portion formed in the surface of the second electrode but not penetrating to the base member, the recessed portion having a rough surface; and
   a wiring that connects said first electrode to said second electrode.

2. A bare chip carrier for holding a bare chip, comprising:
   a base member;
   a first electrode which is located above a principal surface of said base member, and which is to be connected to said bare chip;
   a second electrode which is formed on a back surface of said base member, and which has a recessed portion formed in the surface of the second electrode but not penetrating to the base member, the recessed portion having a conical shape; and a wiring that connects said first electrode to said second electrode.

3. The bare chip carrier according to claim 2, wherein the recessed portion has a rough surface.

4. A bare chip carrier for holding a bare chip, comprising:

a base member;

a first electrode which is located above a principal surface of said base member, and which is to be connected to said bare chip;

a second electrode which is formed on a back surface of said base member, and which has a plate shape and a rough surface portion formed in the surface of the second electrode; and a wiring that connects said first electrode to said second electrode.

5. The bare chip carrier according to claim 4, wherein the rough surface portion of said second electrode comprises a plurality of recessed portions.

6. The bare chip carrier according to claim 4, wherein the rough surface portion of said second electrode comprises a step-wise shape.

* * * * *